(12) United States Patent
Seevinck

(10) Patent No.: US 6,346,855 B1
(45) Date of Patent: Feb. 12, 2002

(54) AMPLIFIER ARRANGEMENT

(75) Inventor: Evert Seevinck, Eersel (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/550,608

(22) Filed: Apr. 14, 2000

(30) Foreign Application Priority Data

Apr. 16, 1999 (EP) .............................. 99201238

(51) Int. Cl.$^7$ ................................ H03F 3/45
(52) U.S. Cl. ................... 330/252; 330/257; 330/260
(58) Field of Search ............... 330/252, 257, 330/260

(56) References Cited

U.S. PATENT DOCUMENTS

| | | | | |
|---|---|---|---|---|
| 3,392,342 A | | 7/1968 | Ordower | 330/22 |
| 4,752,744 A | * | 6/1988 | Aoki | 330/252 |
| 5,929,623 A | * | 7/1999 | Hoshino | 330/257 |
| 5,990,742 A | * | 11/1999 | Suzuki | 330/257 |
| 6,137,364 A | * | 10/2000 | Chiozzi | 330/257 |
| 6,175,276 B1 | * | 1/2001 | Lorenz | 330/260 |

OTHER PUBLICATIONS

"Design of High–Performance Negative–Feedback Amplifier", by Erst H. Nordholt, p. 8, ISBN 0–444–4240–8.

* cited by examiner

*Primary Examiner*—Robert Pascal
*Assistant Examiner*—Khanh V. Nguyen

(57) ABSTRACT

In transconductance amplifier arrangements used in CATV systems, it is often desirable to set the value of the output impedance to a value equal to the system impedance that is often 75Ω. prior art transconductance amplifiers often comprise an amplifier (6) with a current output using a feedback network (8) to set the gain value. An input of the feedback network (8) is coupled to the current output of the amplifier (6) and an output of the feedback network (8) is coupled to the input of the amplifier (6). In these prior art transconductance amplifier arrangements the output impedance decreases with increasing gain of the amplifier (6) used in the amplifier arrangement. This output impedance is normally very low (a few Ω or lower). By adding a further output current (i/N) to the output of the feedback network, it is obtained that the current through the feedback network (8) becomes dependent on the output current (i) of the amplifier. This dependence results in an increased output impedance.

7 Claims, 3 Drawing Sheets

AMPLIFIER ARRANGEMENT

BACKGROUND OF THE INVENTION

The present invention relates to an amplifier arrangement comprising an amplifier having an input terminal and a current output terminal for providing an output current in dependence on a signal at the input terminal, the amplifier further comprises a feedback path coupled between the current output terminal and the input terminal.

Such amplifier arrangement is known from the book "Design of High-Performance Negative-Feedback amplifiers" by Erst H. Nordholt, chapter 1, page 8, FIG. 4, Elsevier Publishing Company 1983, ISBN 0-444-42140-8.

Amplifier arrangements according to the preamble are used in several broadband applications, such as CATV systems. The prior art amplifier arrangement is intended for use with a signal source that behaves as a current source. The current forced by the input source into the amplifier, flows through the feedback path and causes a voltage across said feedback path. Due to the feedback arrangement, the current source in the amplifier supplies an output current which matches the sum of the current that flows in the feedback path and the current that flows into the load impedance of the amplifier arrangement.

The prior art amplifier arrangement shows good high frequency behavior. It further has a low output impedance, which even decreases with increasing gain of the amplifier. This low output impedance is not always desired. E.g. in CATV systems it is desired to drive the load impedance with an amplifier having an output impedance that matches the load impedance. In CATV systems this impedance is equal to 75Ω. This matching of load impedance and output impedance is desired to suppress reflections at the output of the amplifier of RF signals picked up by the coaxial cables in the CATV system.

An obvious solution to this problem could be connecting a resistor in series with the load impedance in order to obtain a desired value of the output impedance. This however would result in half the power generated by the amplifier being dissipated in said series resistor.

SUMMARY OF THE INVENTION

An object of the present invention is to provide an amplifier arrangement according to the preamble having an increased output impedance, without using series resistors dissipating a substantial fraction of the power generated by the amplifier.

To achieve the object of the present invention, the amplifier arrangement is characterized in that the amplifier comprises a further current output terminal for providing a further output current which is dependent on the current flowing through the current output terminal, and in that the second current output terminal is coupled to the output of the feedback network.

By introducing a further current output terminal, and coupling it to the output of the feedback path it is obtained that the voltage drop over the feedback path decreases with an increasing output current of the amplifier. This decrease of the voltage drop over the feedback path has as result that the output voltage of the amplifier arrangement decreases when the output current of the amplifier increases. This effect results in an increased output impedance of the amplifier arrangement. By using an amplifier arrangement according to the present invention is possible to obtain an amplifier arrangement of which the output impedance can be given a predetermined value without needing bulky transformers to obtain an impedance transformation.

An embodiment of the invention is characterized in that the amplifier comprises at least a first and a second transistor, in that a first main electrode of the first transistor being coupled to the current output, in that a first main electrode of the second transistor is coupled to the further current output, in that a second main electrode of the first and the second transistor are coupled to a bias source, and in that a control electrode of the first and second transistor are coupled to the input terminal of the amplifier.

The use of a parallel connected first and second transistor for realizing the current outputs results in a simple amplifier of which the ratio between the two output currents can be chosen by choosing a proper ratio of the emitter areas of the two transistors.

A further embodiment of the invention is characterized in that the amplifier comprises a third transistor, in that a first main electrode of the third transistor is coupled to a supply terminal, in that a second main terminal of the third transistor is coupled to the bias source, in that a control terminal of the third transistor is coupled to a further input of the amplifier, and in that a coupling element is coupled between the further input of the amplifier and a reference terminal.

By adding a third transistor, an amplifier with symmetric inputs is obtained. This makes it possible to use the amplifier arrangement with balanced input signals to convert said balanced signal into an unbalanced signal without needing transformers.

A further embodiment of the invention is characterized in that the feedback path and the coupling element comprise impedance elements with values having a ratio of N/(N+1), in which N is the ratio between the output current and the further output current.

In this embodiment the amplifier can be driven from two balanced current sources.

A still further embodiment of the invention is characterized in that the amplifier further comprises a voltage controlled current source with two input terminals and at least one output terminal, in that the first input terminal of the voltage controlled current sources is coupled to the control electrode of the first and second transistor, in that the second input terminal of the voltage controlled current source is coupled to the control electrode of the third transistor, and in that the output of the voltage controlled current source is also coupled to the control electrode of the third transistor.

In this embodiment the gain of the amplifier is increased due to a positive feedback introduced by the voltage controlled current source. Increasing the gain of the amplifier results in more accurate values of the transimpedance and the output impedance. An advantage of this particular way of increasing the gain of the amplifier is that the high frequency properties are hardly effected. However, care should be taken to ensure stability of the amplifier under all circumstances.

BRIEF DESCRIPTION OF THE DRAWINGS

The invention will now be explained with reference to the drawings wherein same elements are indicated with same reference signs.

DESCRIPTION OF THE PREFERRED EMBODIMENTS

Figure 1:
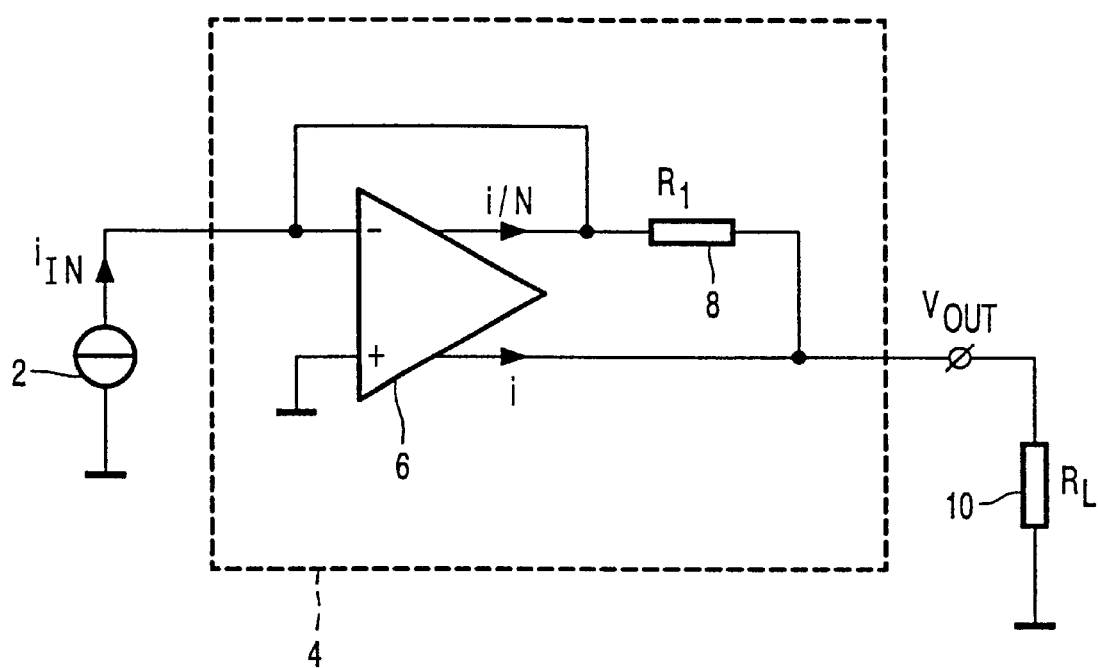
FIG. 1 shows a schematic of the principle of the amplifier arrangement according to the invention.

In the amplifier arrangement according to FIG. 1, an input current source 2 providing an input current $i_{IN}$ is connected to an inverting input of an amplifier 6. A non inverting input of the amplifier 6 is connected to a reference voltage source.

The current output terminal of the amplifier, carrying an output current i, is connected to the output of the amplifier arrangement to which a load impedance 10 with value $R_L$ is connected. The current output terminal is further coupled to the input of the feedback path, which input is here a first terminal of a resistor 8 with value $R_1$. The output of the feedback path, which output is here a second terminal of the resistor 8, is connected to the inverting input of the amplifier 6.

According to the inventive concept of the present invention, the further current output terminal, carrying a current i/N, is coupled to the output of the feedback path, which output is here the second terminal of the resistor 8.

To determine the properties of the amplifier arrangement according to FIG. 1, the open voltage and the output impedance are determined. The open voltage can be determined by setting the value of the load resistor 10 to infinity. If the input impedance of the amplifier is regarded as very high, for the relation between the currents $i_{IN}$ and i can be written:

$$i_{IN} + i + \frac{i}{N} = 0 \Rightarrow i = -i_{IN} \cdot \frac{N}{N+1} \quad (1)$$

If the inverted input of the amplifier 6 is at virtual ground, for the output voltage $V_{OUT}$ can be written:

$$V_{OUT} = i \cdot R_1 \Rightarrow V_{OUT} = -i_{IN} \cdot \frac{N}{N+1} \cdot R_1 \quad (2)$$

Consequently, the transimpedance of the circuit according to the invention is equal to N/(N+1) times the transimpedance of the prior art circuit whose transimpedance is equal to $R_1$.

For determining the output impedance, first the short circuit current is determined. In a short circuit situation, the output voltage $V_{OUT}$ is equal to zero. This means that no current can flow through resistor $R_1$ because the voltage across the resistor 8 is also equal to zero. Consequently, the current i/N is equal to $-I_{IN}$. The short circuit current $I_k$ is now equal to $-N \cdot I_{IN}$. For the output impedance $Z_{OUT}$ of the amplifier arrangement according to FIG. 1 can be written:

$$Z_{OUT} = \frac{V_{OPEN}}{i_K} = \frac{R_1}{N+1} \quad (3)$$

From (3) can be seen that the output impedance strongly depends on N as the transimpedance only varies slightly with N. This makes it possible that the amplifier arrangement according to the invention can be given a suitable output impedance without having to use transformers, which are expensive and have unfavorable properties at very low and very high frequencies.

Figure 2:
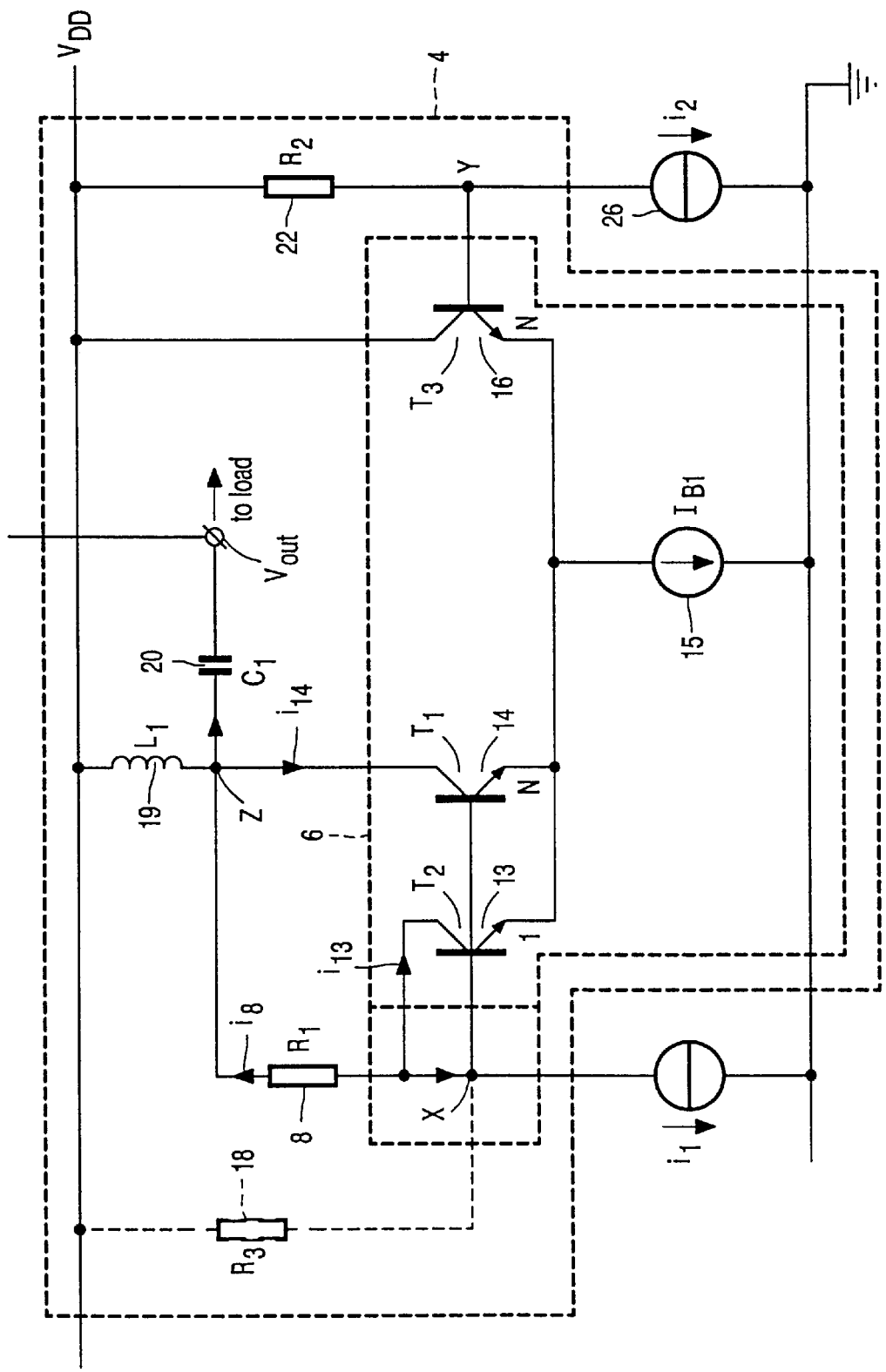
FIG. 2 shows a first embodiment of an amplifier arrangement according to the invention.

In the amplifier arrangement according to FIG. 2, the amplifier 6 is a differential amplifier constituted by transistors 13, 14 and 16. The emitters of the transistors 13, 14 and 16 are connected to a bias current source 15 for receiving a predetermined bias current. The collector of the transistor 14 constitutes the first current output terminal of the amplifier carrying a current $i_{14}$, and the collector of the transistor 13 constitutes the second current output terminal carrying a current $i_{13}$. The emitter areas of the transistors 13 and 14 differ a factor N causing the collector current of the transistor 13 to be a factor N smaller than the collector current of the transistor 14.

The amplifier arrangement according to FIG. 2 is designed for symmetrical input signals and a single ended output signal without using any transformers. The inductor 19 is present to allow the output voltage $V_{OUT}$ to be larger than the supply voltage, which leads to an increased maximum voltage swing at the output. This is in particular important when the transistors 13, 14 and 15 are manufactured in a high-frequency process, which normally only allows low supply voltages.

For determining the output voltage of the amplifier arrangement according to FIG. 2, it is assumed that the gain of the amplifier 6 is large. Consequently, the voltage between the nodes X and Y is equal to zero. The small signal voltage at node Y will be equal to $-i_2 \cdot R_2$. The voltage on the node X is then also equal to $-i_2 \cdot R_2$.

If the amplifier according to FIG. 2 is unloaded, the small signal collector current of transistor 14 flows completely in resistor 8. Applying Kirchhoffs law on the node X results into:

$$i_1 = i_{14} + \frac{i_{14}}{N} \quad (4)$$

From (4) the voltage on node Z can be calculated according to:

$$V_Z = -i_2 \cdot R_2 - i_{14} \cdot R_1 = -i_2 \cdot R_2 + i_1 \cdot \frac{N}{N+1} \cdot R_1 \quad (5)$$

If $R_2$ is chosen equal to $R_1 \cdot N/(N+1)$, (5) changes into $$V_Z = (i_1 - i_2) \cdot \frac{N}{N+1} \cdot R_1 \quad (6)$$

The short circuit current of the amplifier arrangement according to FIG. 2 can be calculated by setting the voltage on node Z equal to zero. The current in resistor $R_1$ will now be equal to $V_X/R_1 = -i_2 \cdot R_2/R_1$. For the collector current of transistor 13 we have now:

$$i_{13} = -\left(i_1 - i_2 \cdot \frac{N}{N+1}\right) \quad (7)$$

For the collector current of transistor 14 can now be found:

$$i_{14} = -\left(i_1 - i_2 \cdot \frac{N}{N+1}\right) \cdot N \quad (8)$$

The short circuit current of the amplifier arrangement is equal to the sum of the current $i_8$ in the resistor 8 and the collector current of transistor 14. Consequently the short circuit current is equal to:

$$i_k = i_8 - i_{14} \quad (9)$$
$$= -i_2 \cdot \frac{N}{N+1} - \left(i_2 \cdot \frac{N^2}{N+1} - N \cdot i_1\right)$$

$$= -i_2 \cdot \left(\frac{N+N^2}{N+1}\right) + N \cdot i_1 = N \cdot (i_1 - i_2)$$

The output impedance $Z_{OUT}$ of the amplifier arrangement can now easily be found by calculating the quotient of (6) and (9). By performing this calculation a value of $R_1/(N+1)$ is found.

The bias current of transistor 13 flows through the resistor 8. This reduces the bias voltage at node X. However to maximize the output voltage swing of the amplifier arrangement, this bias voltage should be at about $\frac{1}{2}V_{DD}$. To avoid a reduction of the voltage swing, the bias current of transistor 13 should not flow through the resistor 8, but should be supplied by some other means. It could be done by a current source, but this requires the availability of PNP transistors. These are however not always available in high frequency IC processes. The bias current of transistor 13 can also be provided by a resistor 18 with value $R_3$, which is connected between the base of transistor 13 and the positive supply voltage. To eliminate the influence of the resistor 18 on the AC behavior of the amplifier arrangement an inductor could be connected in series with the resistor 18.

Alternatively, the influence of the resistor 18 can be compensated by choosing the values of the resistors 8 and 22 according to:

$$R_2 = \frac{1}{\frac{N+1}{N \cdot R_1} + \frac{1}{R_3}} \tag{10}$$

From the expressions derived above, design equations can be derived. For proper impedance matching the output impedance $Z_{OUT}$ should be equal to the value $R_L$ of the load resistance connected to the amplifier arrangement. Thus follows the first design equation $$R_1 = (N+1) \cdot R_L \tag{11}$$

Substituting (11) into (10) gives $$R_2 = \frac{1}{\frac{1}{N \cdot R_L} + \frac{1}{R_3}} = \frac{R_3 \cdot N \cdot R_L}{R_3 + N \cdot R_L} \tag{12}$$

Using (6) and the value of the output impedance of the amplifier arrangement calculated earlier, results into the output voltage $V_{OUT}$ of the amplifier arrangement according to:

$$V_{OUT} = V_Z \cdot \frac{R_L}{Z_{OUT} + R_L} = (i_1 - i_2) \cdot \frac{N \cdot R_L}{2} \tag{13}$$

Since the input currents are balanced, the input current is effectively doubled by ($i_1-i_2$). This results in a value for the transimpedance gain $G_T$ of the amplifier arrangement according to:

$$G_T = N \cdot R_L \tag{14}$$

The following procedure can now be followed to design the circuit. Since the value of the load impedance $R_L$ with which the amplifier arrangement has to be used is known, the value of N can be determined from the required value of the transimpedance gain using (14). Next, the value $R_1$ follows from (11). Then the value $R_3$ is chosen such that the DC bias voltage at node X is about half the supply voltage. Finally the value $R_2$ follows from (12). The last two steps can be iterated a few times to achieve maximum output voltage swing.

Figure 3:
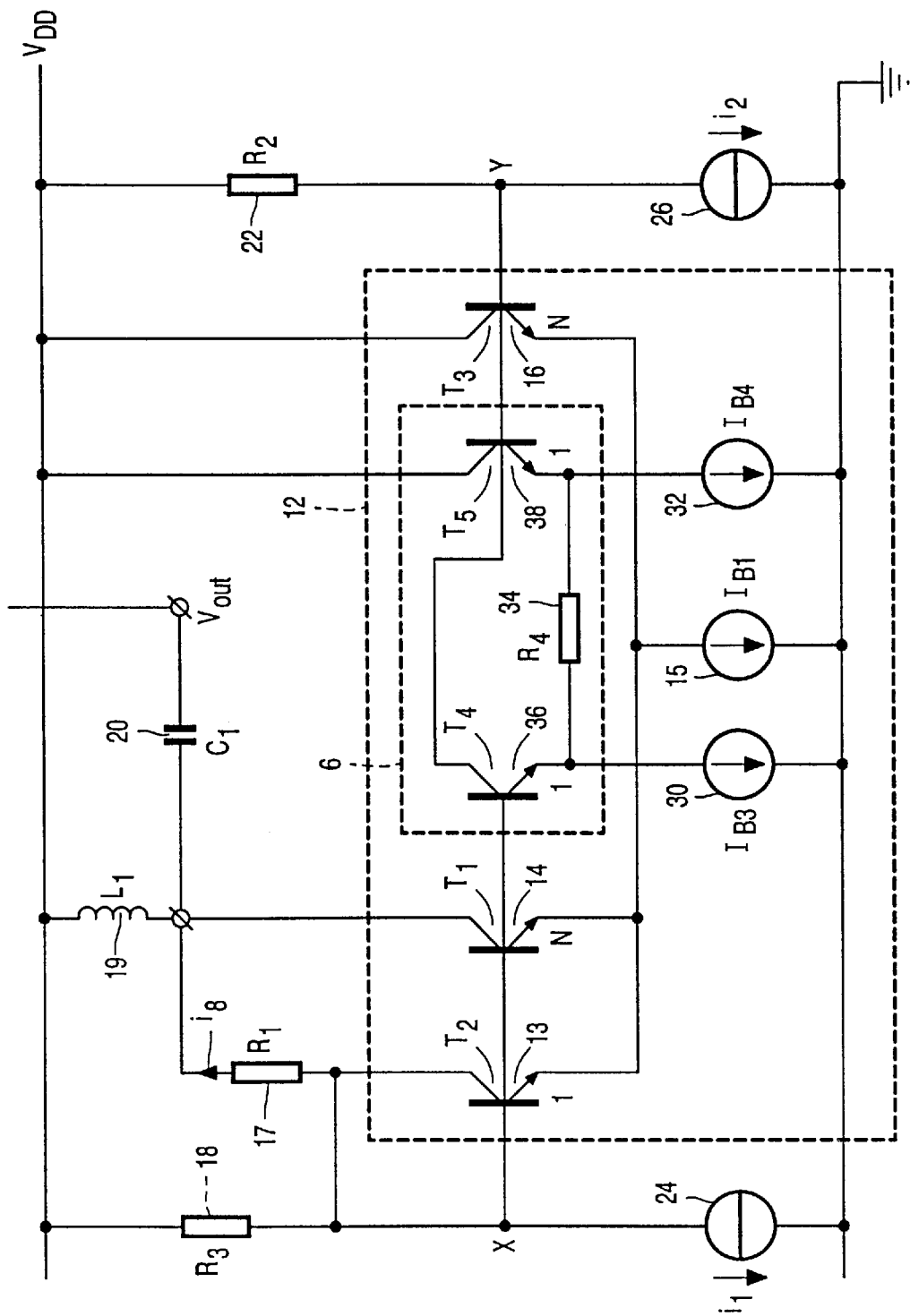
FIG. 3 shows a second embodiment of an amplifier arrangement according to the invention.

FIG. 3 shown the embodiment of the invention according to FIG. 2, to which a voltage controlled current source 33 is added. The inputs of the voltage controlled current source 33 are connected to the nodes X and Y. The output of the voltage controlled current source is connected to node Y.

The voltage controlled current source adds a compensation voltage source between the nodes X and Y having a substantial equal amplitude but a different sign than the original voltage between the nodes X and Y. This causes the actual voltage between the nodes X and Y to decrease. The smaller voltage between the nodes X and Y reduces the distortion in the amplifier 12.

As the use of the voltage controlled current source involves positive feedback, care should be taken to ensure stability of the amplifier. This can be done by limiting the transconductance of the voltage controlled current source to a predetermined value.

The voltage controlled current source 33 is realized by an emitter degenerated differential pair comprising transistors 36 and 38. The emitters of the transistors 36 and 38 are connected to bias sources 30 and 32 and are connected to each other via a resistor 34 with value $R_4$. The output of the voltage controlled current source which is constituted by the collector of the transistor 36 is connected to the node Y. The output current of the voltage controlled current source generates the compensating voltage in series with the amplifier inputs across the resistor 22 with value $R_2$.

Simulations of the circuit showed an −3 dB bandwidth of 1.1 GHz, without showing any peaking. The bandwidth can be increased beyond 2 GHz by adding a small capacitor with value of ≈1 pF between node X and ground.

What is claimed is:

1. Amplifier arrangement comprising:
    an amplifier that includes:
        an input terminal and
        a current output terminal for providing an output current in dependence upon a signal at the input terminal, and
    a feedback path comprising an impedance element having a first and second terminal,
        the first terminal of the impedance element being coupled to the current output terminal and
        the second terminal of the impedance element being coupled to the input terminal,
    characterized in that:
    the amplifier comprises
        a further current output terminal for providing a further output current which is dependent on the output current, and
        the further current output terminal is coupled to the second terminal of the impedance element.

2. Amplifier arrangement according to claim 1, characterized in that:
    an input of the amplifier arrangement is coupled to the input terminal of the amplifier, and
    an output of the amplifier arrangement is coupled to the current output terminal.

3. Amplifier arrangement according to claim 1, characterized in that the amplifier comprises at least a first and a second transistor, in that a first main electrode of the first transistor being coupled to the current output, in that a first main electrode of the second transistor is coupled to the further current output, in that a second main electrode of the first and the second transistor are coupled to a bias source, and in that a control electrode of the first and second transistor are coupled to the input terminal of the amplifier.

4. Amplifier arrangement according to claim 3, characterized in that
a ratio between emitter areas of the first and the second transistors is equal to a ratio between the output current and the further output current.

5. Amplifier arrangement according to claim 3, characterized in that the amplifier comprises a third transistor, in that a first main electrode of the third transistor is coupled to a supply terminal, in that a second main terminal of the third transistor is coupled to the bias source, in that a control terminal of the third transistor is coupled to a further input of the amplifier, and in that a coupling element is coupled between the further input of the amplifier and the supply terminal.

6. Amplifier arrangement according to claim 5, characterized in that the feedback path and the coupling element comprise impedance elements with values having a ratio of N/(N+1), in which N is the ratio between the output current and the further output current.

7. Amplifier arrangement according to claim 3, characterized in that the amplifier further comprises a voltage controlled current source with two input terminals and at least one output terminal, in that the first input terminal of the voltage controlled current sources is coupled to the control electrode of the first and second transistor, in that the second input terminal of the voltage controlled current source is coupled to the control electrode of the third transistor, and in that the output of the voltage controlled current source is also coupled to the control electrode of the third transistor.

* * * * *